(12) United States Patent
Park et al.

(10) Patent No.: US 10,342,127 B2
(45) Date of Patent: Jul. 2, 2019

(54) ELECTRONIC DEVICE INCLUDING A REINFORCED PRINTED CIRCUIT BOARD

(71) Applicant: Samsung Electronics Co., Ltd., Gyeonggi-do (KR)

(72) Inventors: Jung Hoon Park, Incheon (KR); Jin Woo Kim, Seoul (KR); Dae Kwang Kim, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/351,087

(22) Filed: Nov. 14, 2016

(65) Prior Publication Data

US 2018/0139862 A1    May 17, 2018

(51) Int. Cl.
| H05K 1/09 | (2006.01) |
| H05K 1/11 | (2006.01) |
| H05K 5/02 | (2006.01) |
| H05K 7/14 | (2006.01) |
| H05K 1/02 | (2006.01) |

(52) U.S. Cl.
CPC ............. *H05K 1/09* (2013.01); *H05K 1/0271* (2013.01); *H05K 2201/09063* (2013.01); *H05K 2201/10363* (2013.01); *H05K 2201/2009* (2013.01)

(58) Field of Classification Search
CPC . H05K 1/09; H05K 1/11; H05K 1/113; H05K 1/115; H05K 1/0271; H05K 3/4602; H05K 5/02; H05K 7/14; H05K 2201/099; H05K 2201/1034; H05K 2201/2009; H05K 2201/09063; H05K 2201/09436; H05K 2201/09736; H05K 2201/10083; H05K 2201/10121; H05K 2201/10363; H05K 2201/10674

USPC .......................................... 361/752; 174/257
See application file for complete search history.

(56) References Cited

U.S. PATENT DOCUMENTS

| 5,004,639 A | * | 4/1991 | Desai | ........................ B32B 7/02 |
| | | | | 428/138 |
| 7,435,911 B2 | | 10/2008 | Kim et al. | |
| 7,888,599 B2 | | 2/2011 | Kim et al. | |
| 2006/0101640 A1 | * | 5/2006 | Lee | ....................... H05K 3/4691 |
| | | | | 29/846 |
| 2006/0144617 A1 | | 7/2006 | Kim et al. | |
| 2008/0314863 A1 | | 12/2008 | Kim et al. | |
| 2014/0000946 A1 | * | 1/2014 | Hosoi | ..................... H05K 1/115 |
| | | | | 174/257 |
| 2017/0231109 A1 | * | 8/2017 | Yang | ..................... H05K 1/0206 |

FOREIGN PATENT DOCUMENTS

| CN | 105578839 A | * | 5/2016 | ............... H05K 7/20 |
| KR | 20070064704 | | 6/2007 | |
| KR | 20080028821 | | 4/2008 | |

* cited by examiner

*Primary Examiner* — Timothy J Thompson
*Assistant Examiner* — Guillermo J Egoavil
(74) *Attorney, Agent, or Firm* — The Farrell Law Firm, P.C.

(57) ABSTRACT

An electronic device including reinforced printed circuit board is provided. The electronic device includes the printed circuit board including a first area, and a second area that extends from a first end of the first area. A width of the second area is smaller than a width of the first area, and at least a portion of a surface of the second area is covered by a material layer that provides the second area with a specific strength.

14 Claims, 12 Drawing Sheets

ELECTRONIC DEVICE INCLUDING A REINFORCED PRINTED CIRCUIT BOARD

PRIORITY

This application claims priority under 35 U.S.C. § 119(a) to Korean Patent Application Serial No. 10-2015-0160004, which was filed in the Korean Intellectual Property Office on Nov. 13, 2015, the entire disclosure of which is incorporated herein by reference.

BACKGROUND

1. Field of the Disclosure

The present disclosure relates generally to an electronic device including a printed circuit board.

2. Description of the Related Art

As electronic devices have become slimmer and more lightweight, printed circuit boards for use therein have also become thinner. Consequently, these thinner printed circuit boards are more easily damaged by even small impacts to the electronic devices.

Conventionally, when an area of a printed circuit board has a narrower width than an adjacent area thereof, the narrower area is more easily damaged by an external force. For example, the narrow area may be easily bent or broken, impeding the proper operation of the electronic device.

SUMMARY

The present disclosure is made to address at least the above-mentioned problems and/or disadvantages and to provide at least the advantages described below.

Accordingly, an aspect of the present disclosure is to provide an electronic device including a printed circuit board including a reinforced an area, which has a relatively small width.

In accordance with an aspect of the present disclosure, an electronic device is provided. The electronic device includes including a first area, and a second area that extends from a first end of the first area. A width of the second area is smaller than a width of the first area, and at least a portion of a surface of the second area is covered by a material layer that provides the second area with a specific strength.

In accordance with another aspect of the present disclosure, an electronic device is provided. The electronic device includes a housing; a printed circuit board that is arranged inside the housing, the printed circuit board including a first surface that faces a first direction, a second surface that faces a second direction, which is opposite to the first direction, and a side surface that faces a third direction, which is different from the first direction and the second direction; an opening adjacent to the side surface of the printed circuit board; an electronic component arranged in the opening; and a conductive material that electrically connects the electronic component and the printed circuit board. The opening is defined by a portion of the printed circuit board and a structure that extends from the printed circuit board, and at least a portion of the structure is formed of or covered by the conductive material.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
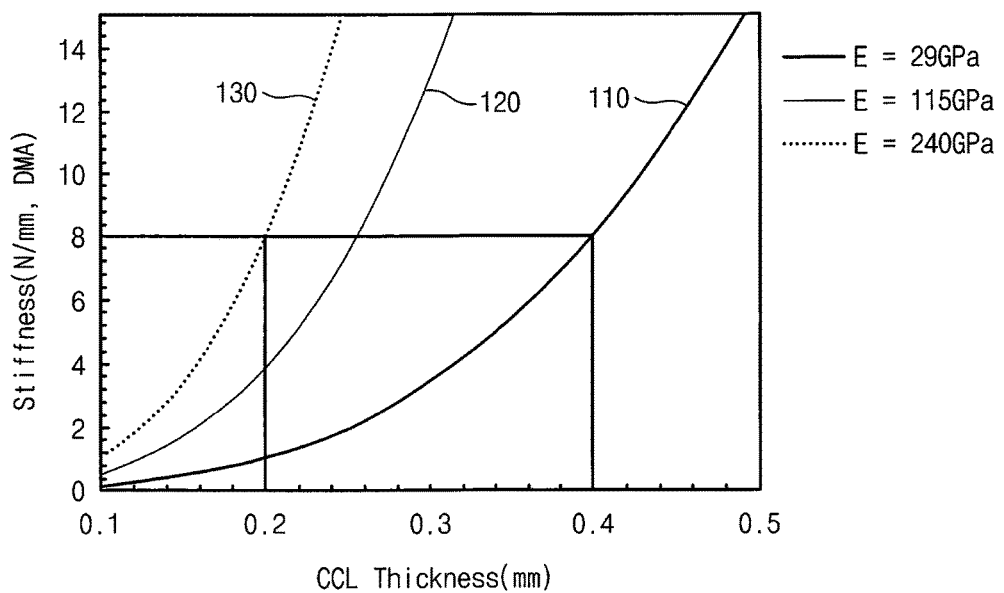
FIG. 1 is a graph illustrating stiffness of a printed circuit board versus thickness thereof according to an embodiment of the present disclosure.

Various embodiments of the present disclosure are described with reference to accompanying drawings. Accordingly, those of ordinary skill in the art will recognize that modifications, equivalents, and/or alternatives of the various embodiments described herein can be made without departing from the scope and spirit of the present disclosure.

With regard to description of drawings, similar elements may be marked by similar reference numerals.

Terms used in the present disclosure are used to describe specific embodiments and are not intended to limit the scope of the present disclosure.

The terms of a singular form may include plural forms unless otherwise specified.

Unless otherwise defined as such herein, all the terms used herein, which include technical or scientific terms, may have the same meaning that is generally understood by a person skilled in the art.

Terms that are defined in a dictionary and commonly used should also be interpreted as is customary in the relevant related art and not in an idealized or overly formal detect unless expressly defined as such herein. However, in some cases, even if terms are defined in the specification, they are not to be interpreted to exclude embodiments of the present disclosure.

Herein, the terms "have", "may have", "include", "comprise", "may include", and "may comprise" indicate an existence of corresponding features (e.g., elements such as numeric values, functions, operations, or components) but do not exclude presence of additional features.

The terms "A or B", "at least one of A or/and B", "one or more of A or/and B", etc., may include any and all combinations of one or more of the associated listed items. For example, the term "A or B", "at least one of A and B", or "at least one of A or B" may refer to (1) where at least one A is included, (2) where at least one B is included, or (3) where both of at least one A and at least one B are included.

Terms, such as "first", "second", etc., used herein may refer to various elements, but do not limit the elements. For example, such terms may be used to distinguish one element from another element. Accordingly, "a first user device" and "a second user device" may indicate different user devices regardless of the order or priority thereof.

When an element (e.g., a first element) is referred to as being "(operatively or communicatively) coupled with/to" or "connected to" another element (e.g., a second element), the first element may be directly coupled with/to or connected to the second element or an intervening element (e.g., a third element) may be present therebetween. However, when the first element is referred to as being "directly coupled with/to" or "directly connected to" the second element, no intervening elements are present.

According to context, the expression "configured to" used herein may be used interchangeably with, for example, "suitable for", "having the capacity to", "designed to", "adapted to", "made to", or "capable of".

The term "configured to" does not only mean "specifically designed to" in hardware. Instead, the expression "a device configured to" may mean that the device is "capable of" operating together with another device or other components. A "processor configured to perform A, B, and C" may mean a dedicated processor (e.g., an embedded processor) for performing a corresponding operation or a generic-purpose processor (e.g., a central processing unit (CPU) or an application processor) which may perform corresponding operations by executing one or more software programs that are stored in a memory device.

An electronic device according to an embodiment of the present disclosure may include a smartphone, a tablet personal computer (PC), a mobile phone, a video telephone, an e-book reader, a desktop PC, a laptop PC, a netbook computer, a workstation, a server, a personal digital assistant (PDA), a portable multimedia player (PMP), a Motion Picture Experts Group (MPEG-1 or MPEG-2) Audio Layer 3 (MP3) player, a mobile medical device, a camera, a wearable device (e.g., a head-mounted-device (HMD), such as electronic glasses), electronic apparel, an electronic bracelet, an electronic necklace, an electronic appcessory, an electronic tattoo, a smart watch, etc.

An electronic device may also be a home appliances, such as a television (TV), a digital versatile disc (DVD) player, an audio player, a refrigerator, an air conditioner, a cleaner, an oven, a microwave oven, a washing machine, an air cleaner, a set-top box, a home automation control panel, a security control panel, a TV box (e.g., Samsung HomeSync®, Apple TV®, or Google TV®), a game console (e.g., Xbox® or PlayStation®), an electronic dictionary, an electronic key, a camcorder, an electronic picture frame, etc.

An electronic device may also be a medical device (e.g., a portable medical measurement device, such as a blood glucose monitoring device, a heartbeat measuring device, a blood pressure measuring device, a body temperature measuring device, etc.), a magnetic resonance angiography (MRA) device, a magnetic resonance imaging (MRI) device, a computed tomography (CT) device, a scanner, and an ultrasonic device), a navigation device, a global positioning system (GPS) receiver, an event data recorder (EDR), a flight data recorder (FDR), a vehicle infotainment device, electronic equipment for a vessel (e.g., a navigation system and a gyrocompass), avionics, a security device, a head unit for a vehicle, an industrial or home robot, an automatic teller machine (ATM), a point of sales (POSs) device, or an Internet of things (IoT) device (e.g., a light bulb, a sensor, an electric or gas meter, a sprinkler device, a fire alarm, a thermostat, a street lamp, a toaster, exercise equipment, a hot water tank, a heater, a boiler, etc.).

An electronic device may also be a part of furniture or a building/structure, an electronic board, an electronic signature receiving device, a projector, or a measuring instrument (e.g., a water meter, an electricity meter, a gas meter, a wave meter, etc.).

An electronic device may also be a flexible device.

An electronic device may also be a combination of the above-described devices.

However, an electronic device according to an embodiment of present disclosure is not be limited to the above-described electronic devices and may include other electronic devices and new electronic devices according to the development of technologies.

Herein, the term "user" may refer to a person who uses an electronic device or may refer to a device (e.g., an artificial intelligence electronic device) that uses the electronic device.

FIG. 1 is a graph illustrating stiffness of a printed circuit board versus thickness thereof according to an embodiment of the present disclosure.

Referring to FIG. 1, the X axis indicates a thickness of a printed circuit board (PCB), and the Y axis indicates a strength (stiffness) of the printed circuit board. Additionally, a graph 110, which is indicated by a thick solid line, represents a force of 240 GPa being applied, a graph 120, which is indicated by a thin solid line, represents a force of 115 GPa being applied, and the graph 130, which is indicated by a dotted line, represents a force of 29 GPa being applied.

Although a copper clad laminate (CCL) is used as a raw material of the printed circuit board in FIG. 1, according to various embodiments of the present invention, the printed circuit board may also be a 2-layered flexible copper clad laminate (2CCL) or a dry film solder resist (DFSR). Further, the printed circuit board may be a flexible printed circuit board (FPCB).

Referring to the graph 110, when the thickness of the printed circuit board is 0.2 mm, the stiffness of the printed circuit board is about 1 N/mm, when the thickness of the printed circuit board is 0.3 mm, the stiffness of the printed circuit board is about 4 N/mm, and when the thickness of the printed circuit board is 0.4 mm, the stiffness of the printed circuit board is about 8 N/mm. Accordingly, as the thickness of the printed circuit board increases, the stiffness that endures a force applied to the printed circuit board increases. The graph 110 represents that the stiffness versus the thickness of the printed circuit board shows a quadratic function. The explanation of the graph 110 (the relationship between the thickness and the stiffness) also may be applied to the graph 120 and the graph 130. Basically, if a printed circuit board becomes thicker, the printed circuit board may endure a stronger force.

Figure 2:
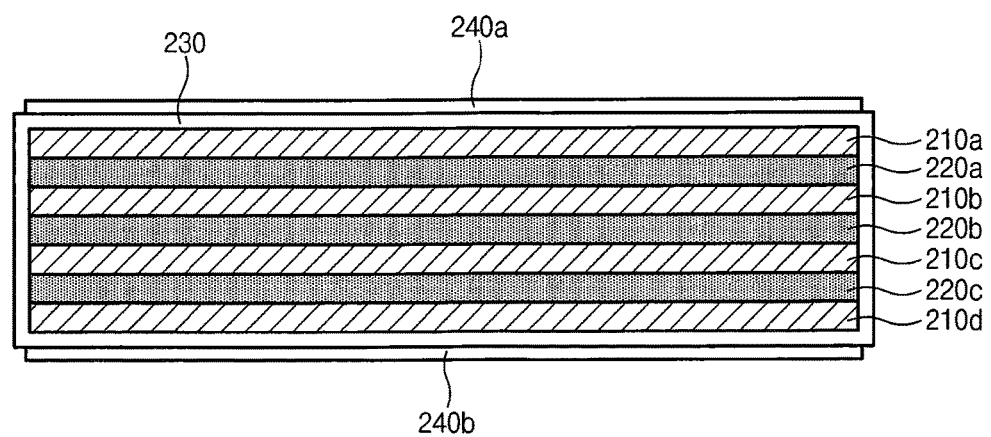
FIG. 2 illustrates a section of a printed circuit board according to an embodiment of the present disclosure.

FIG. 2 illustrates a section of a multilayered printed circuit board according to an embodiment of the present disclosure.

Referring to FIG. 2, the printed circuit board may correspond to a portion of a printed circuit board included in an electronic device. In the detail, the printed circuit board included in the electronic device may have a relatively large width, and the printed circuit board of FIG. 2 may correspond to a portion of the printed circuit board included in the electronic device and may correspond to a relatively narrow area. The section of the printed circuit board of FIG. 2 may be a section obtained by partially cutting away the width of the narrow area.

In FIG. 2, the upper surface of the printed circuit board may face the front surface (for example, a front case) of the electronic device, and the lower surface of the printed circuit board may face the rear surface (for example, a rear case or a battery cover) of the electronic device.

The printed circuit board includes a plurality of copper foil layers 210a to 210d, and epoxy layers 220a to 220d arranged between the copper foil layers 210a to 210d, respectively.

The surface of the printed circuit board may be covered by a plating layer 230. The plating layer 230 may be gold, silver, or copper.

Although FIG. 2 illustrates a single layer plating layer, the surface of the printed circuit board may be covered by two or more plating layers. At least an area of a side surface of the printed circuit board (that is close to a periphery of a side surface of the electronic device) may optionally not be covered by a separate plating layer.

Further, to increase the stiffness of the printed circuit board, lead layers 240a and 240b are arranged on the upper and lower surfaces of the printed circuit board, respectively, increasing the thickness of the printed circuit board. Alternatively, only the lead layer 240a may be arranged on the upper surface of the printed circuit board or only the lead layer 240b may be arranged on the lower surface of the printed circuit board.

Although FIG. 2 illustrates the surfaces of the lead layers 240a and 240b as being flat, the surfaces of the lead layers 240a and 240b may not be flat because of a process of arranging the lead layers 240. For example, at least a portion of the surfaces of the lead layers 240 may include a portion having a different height.

Although FIG. 2 illustrates a multilayered printed circuit board as an example, embodiments of the present disclosure also may be applied to a single-layered printed circuit board.

Figure 3:
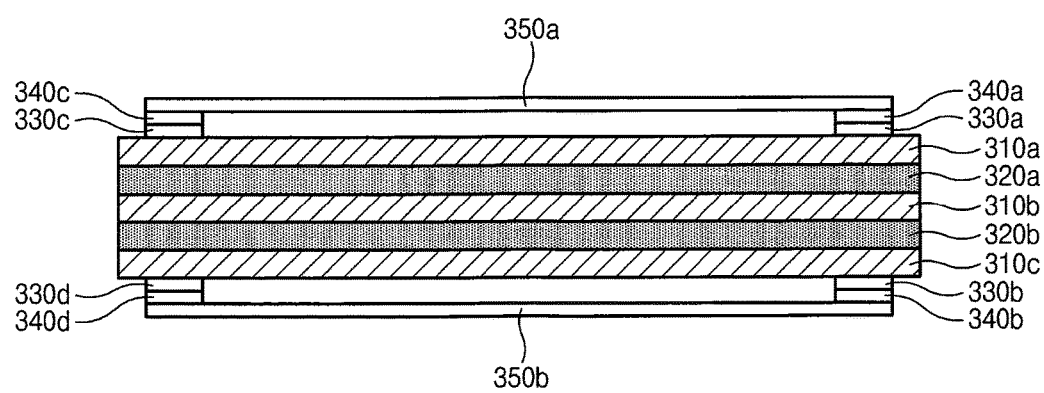
FIG. 3 illustrates a section of a printed circuit board according to an embodiment of the present disclosure.

FIG. 3 illustrates a section of a printed circuit board according to an embodiment of the present disclosure. Similar to the printed circuit board of FIG. 2, the printed circuit board of FIG. 3 corresponds to a relatively narrow area of a printed circuit board that may be included in an electronic device.

Referring to FIG. 3, the printed circuit board includes a plurality of copper foil layers 310a to 310c similar to the printed circuit board of FIG. 2, and includes epoxy layers 320a to 320c between the plurality of copper foil layers 310a to 310c.

Plating layers 330a to 330d are arranged on the upper and lower surfaces of the printed circuit board. The plating layers 330a to 330d are covered by lead layers 340a to 340d. The lead layers 340a to 340d are used as bonding members for fixing stainless steel layers 350a and 350b. That is, the stainless steel layers 350a and 350b may be attached to the printed circuit board through soldering to increase the stiffness of the printed circuit board.

Because a narrow area of printed circuit board may be vulnerable to "deflection" due to a force applied from the outside, the strength of the printed circuit board of FIG. 3 is reinforced through the stainless steel layers 350a and 350b.

In the printed circuit board of FIG. 2, the plating layer 230 may be further applied to prevent air from being generated between the lead layers 240a and 240b and the printed circuit board to increase the strength of the printed circuit board of FIG. 2 more than the strength of the printed circuit board of FIG. 3.

The material of the lead layers 240a and 240b is not limited to lead, and may include a tin-silver-copper (Sn—Ag—Cu) alloy, low temperature solder, or ceramic as a metallic or non-metallic material for a surface-mounted device (SMD).

The plating layer 230 and the lead layers 240a and 240b of the printed circuit board of FIG. 2 are formed of materials that are used in the original process. When a printed circuit board of FIG. 2 is compared with a printed circuit board of FIG. 3, the printed circuit board of FIG. 2 may provide advantages such as saving time for process, saving materials because the printed circuit board of FIG. 2 does not use a stainless steel layer 350a or 350b in FIG. 3.

Figure 4:
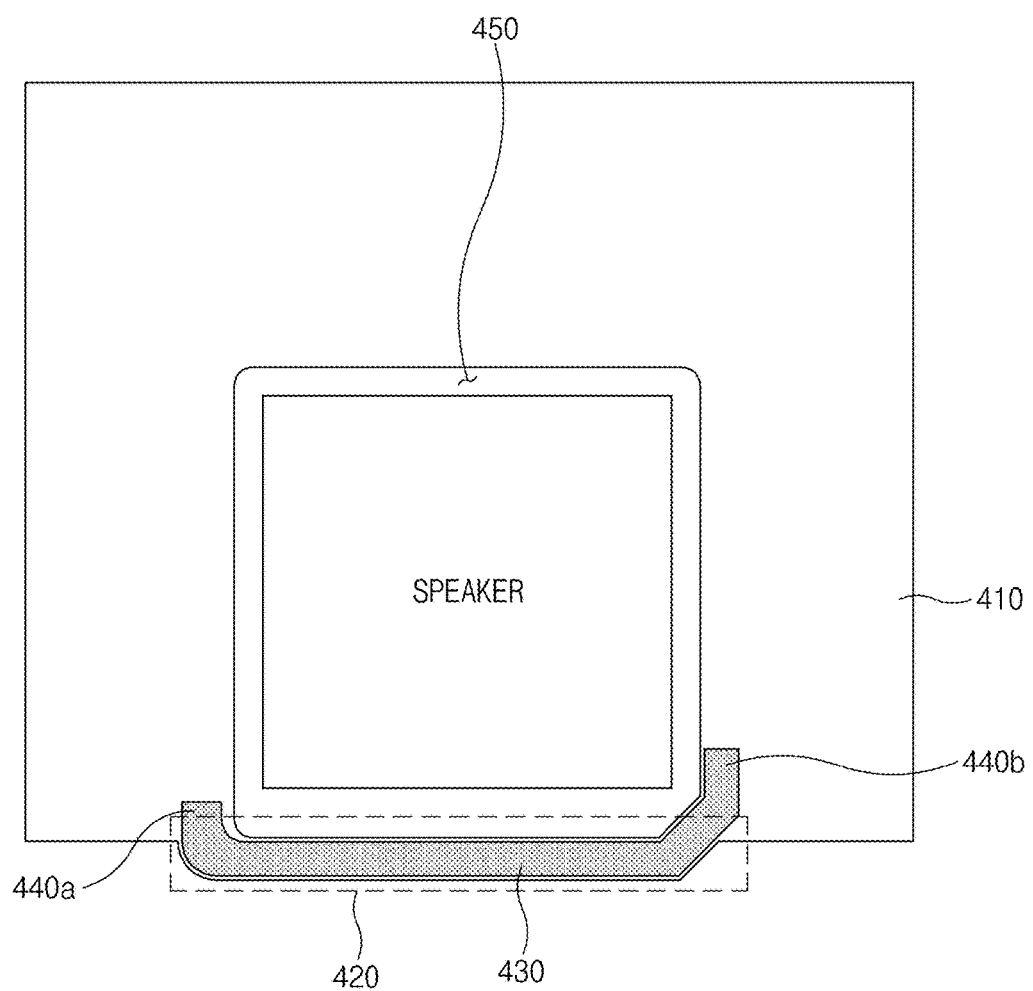
FIG. 4 illustrates a top view of a printed circuit board covered by a material layer for strength according to an embodiment of the present disclosure.

FIG. 4 illustrates a top view of a printed circuit board covered by a material layer for strength according to an embodiment of the present disclosure.

Referring to FIG. 4, the printed circuit board includes a relatively wide area 410 and a relatively narrow area 420. That is, narrow area 420 extends from an end of the wide area 410. The printed circuit board 400 includes a through-hole 450. For example, at least one of a speaker, a receiver, and various sensors, such as a camera sensor and a proximity sensor, may be arranged in the through-hole 450.

A material layer 430 for increasing the strength of the printed circuit board, in particular, the narrow area 420, is arranged on a surface of the narrow area 420. For example, the material layer 430 may be a lead layer. Although not illustrated in FIG. 4, a plating layer may also be provided between the lead layer 430 and area 420.

The lead layer 430 may be arranged throughout the wide area 410 as well as on narrow area 420. In FIG. 4, ends 440a and 440b of the lead layer 430 are on the wide area 410. A large deflection may be caused in the narrow area 420, for example, due to a change in external pressure or temperature. Therefore, for strength, it may be preferable for the lead layer 430 be laid in the wide area 410 having a relatively small deflection (i.e., an area that may endure a factor that causes a deflection).

In FIG. 4, the lead layer 430 is arranged on the narrow area 420, but does not fully cover the narrow area 420. That is, the lead layer 430 is arranged on a portion of the wide area 420. However, the lead layer 430 may have various patterns that may cover the narrow area 420.

According to various embodiments, the narrow area 420 (or a material layer) comprises a part formed by a lead and the narrow area 420 comprises the rest part formed by a stainless steel layer.

FIGS. 5 to 8 illustrates top views of printed circuit boards covered by a material layer for strength according to various embodiments of the present disclosure.

Figure 5:
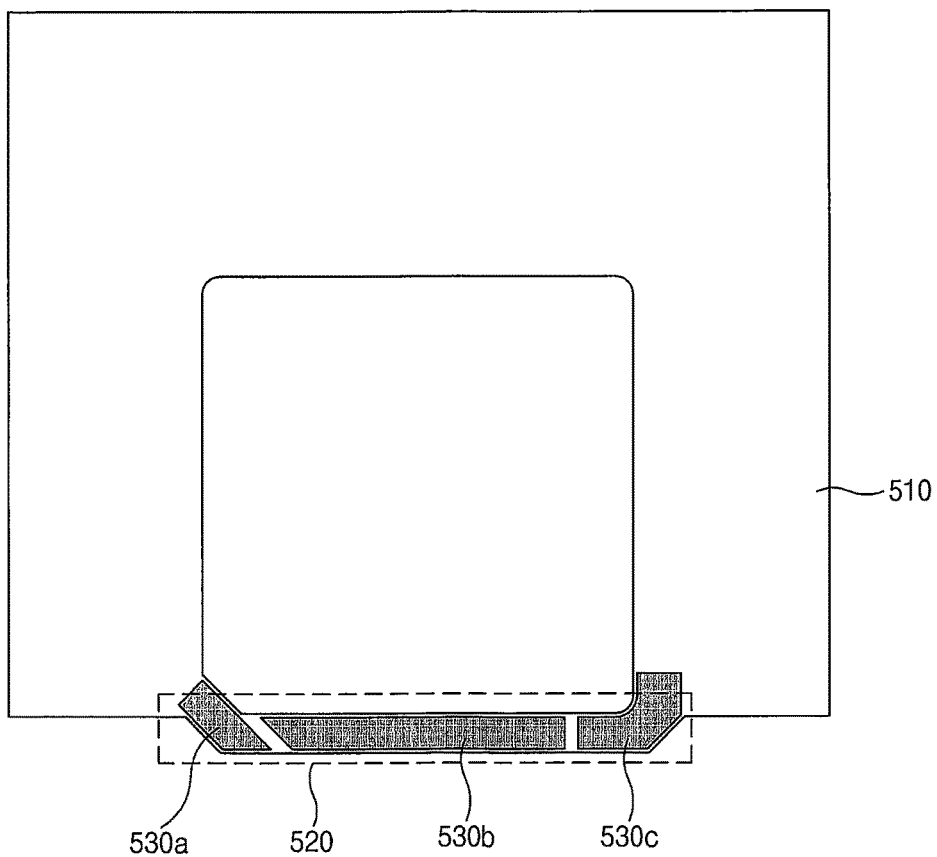
FIG. 5 illustrates a top view of a printed circuit board covered by a material layer for strength according to an embodiment of the present disclosure.

Referring to FIG. 5, the printed circuit board includes a relatively wide area 510 and a relatively narrow area 520. Lead layers 530a, 530b, and 530c that are divided into three segments may be arranged on the narrow area 520. When the lead layers 530a, 530b, and 530c are spaced apart from each other by a specific gap as in FIG. 5, costs of the lead material corresponding to the gap size may be saved, as compared with the lead layer 430 that is continuously arranged as in FIG. 4.

The division of the lead layers 530a, 530b, and 530c may be determined in consideration of a deflected part. For example, the division between the lead layers 530a and 530b, and the division between the lead layers 530b and 530c may be part that are not easily deflected.

Figure 6:
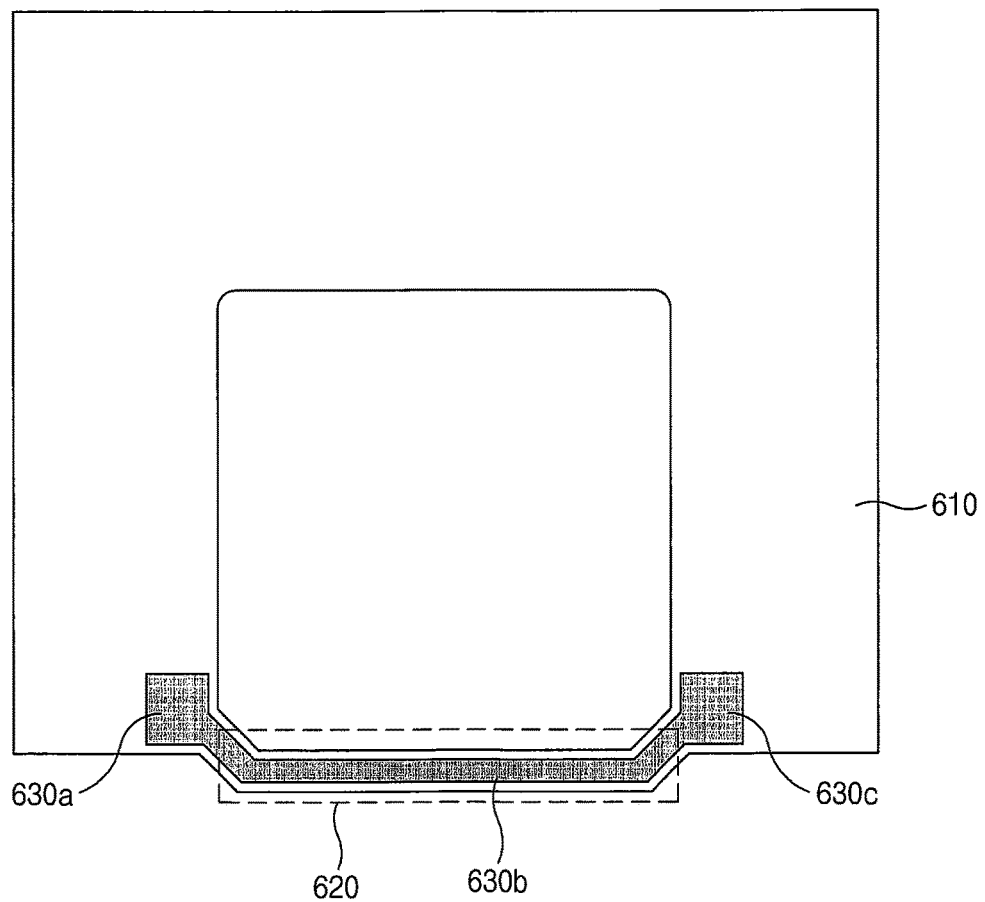
FIG. 6 illustrates a top view of a printed circuit board covered by a material layer for strength according to an embodiment of the present disclosure.

Referring to FIG. 6, the printed circuit board includes a relatively wide area 610 and a relatively narrow area 620.

In FIG. 6, compared with FIG. 4, larger ends 630a and 630c of the lead layers 630a, 630b, and 630c are laid in the wide area 610 because stresses due to deflection may be large where the wide area 610 and narrow area 620 contact each other (i.e., the area in which the narrow area 620 extends from the wide area 610). According to various embodiments, a width of a portion of the narrow area 620 is different from a width of other portions of the narrow area 620.

Figure 7:
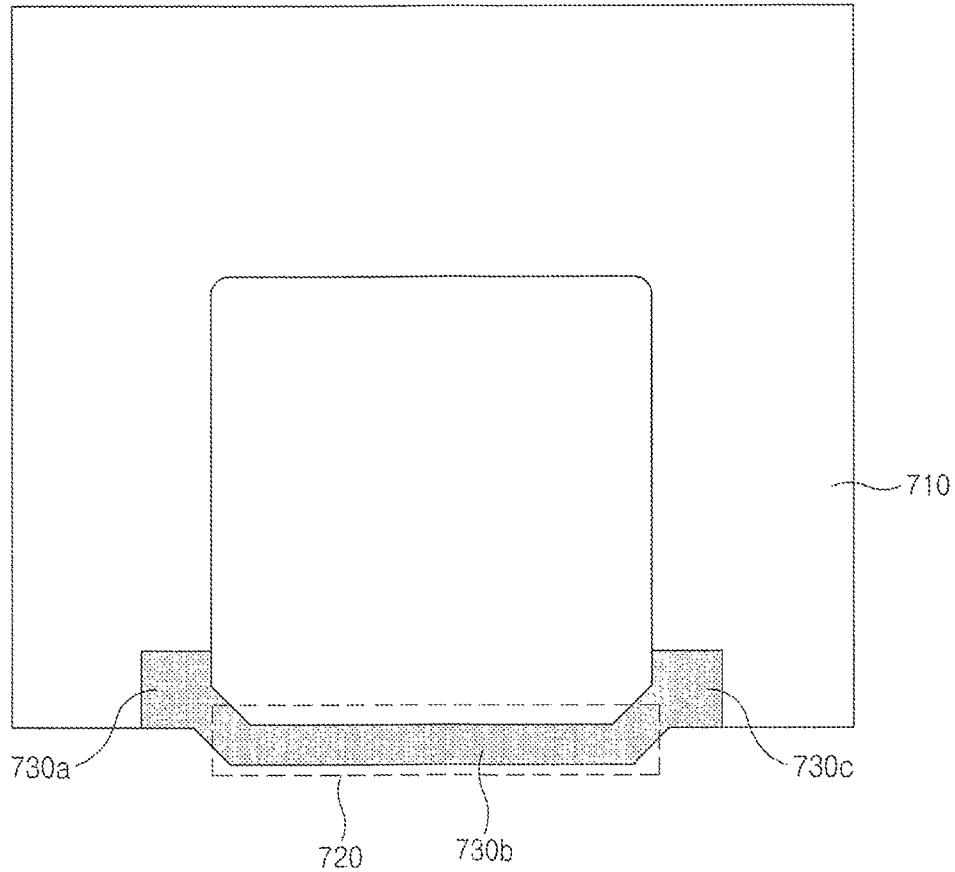
FIG. 7 illustrates a top view of a printed circuit board covered by a material layer for strength according to an embodiment of the present disclosure.

Referring to FIG. 7, the printed circuit board includes a relatively wide area 710 and a relatively narrow area 720.

In FIG. 7, compared with FIG. 6, lead layers 730a, 730b, and 730c fully occupy the narrow area 720. In this case, a gain may be obtained in process speed because a separate pattern is not considered. Although not illustrated in FIG. 7, a lead layer may also be arranged at a side surface of the narrow area 720.

Figure 8:
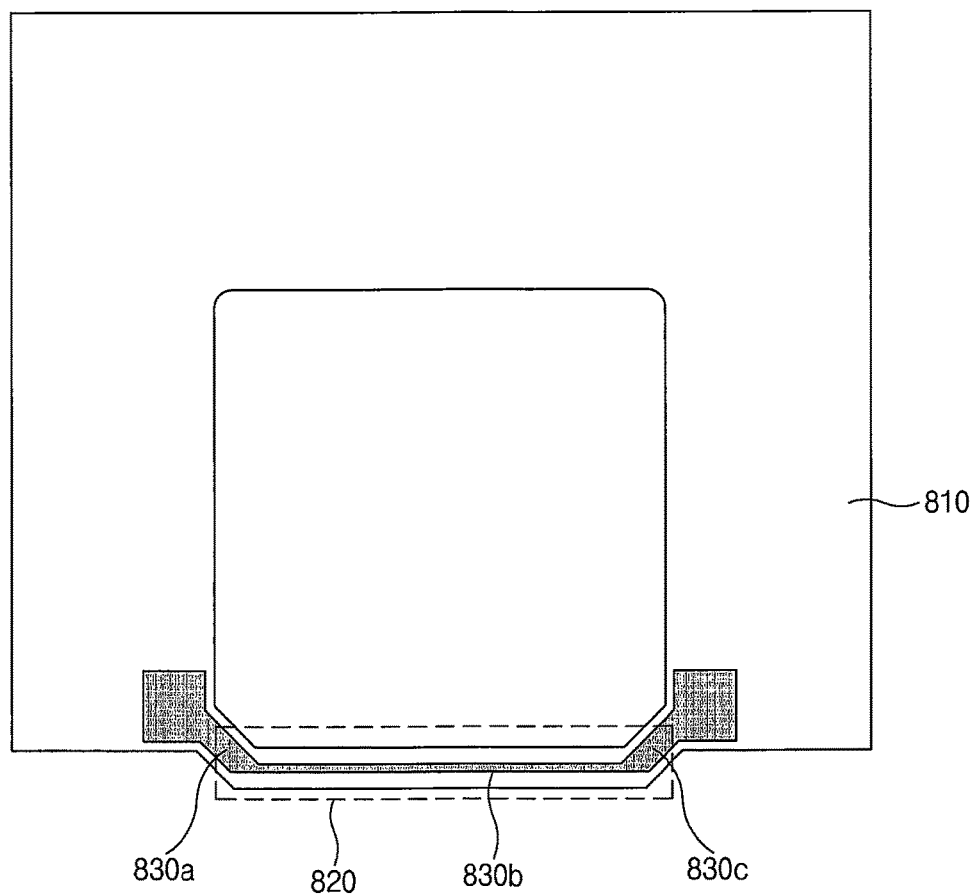
FIG. 8 illustrates a top view of a printed circuit board covered by a material layer for strength according to an embodiment of the present disclosure.

Referring to FIG. 8, the printed circuit board includes a relatively wide area 810 and a relatively narrow area 820.

In FIG. 8, compared with FIG. 6, a lead layer 830b is thinner than lead layers 830a and 830c because the stresses due to the deflection of the lead layer 830b may be lower than the stresses due to the deflections of the lead layer 830a and 830b.

Although not illustrated in FIGS. 4 to 8, a plating layer may be laid in a relatively narrow area, even in an area of the printed circuit board that is not covered by a lead layer. Further, a plating layer may be laid even on a side surface of a relatively narrow area of the printed circuit board.

Figure 9:
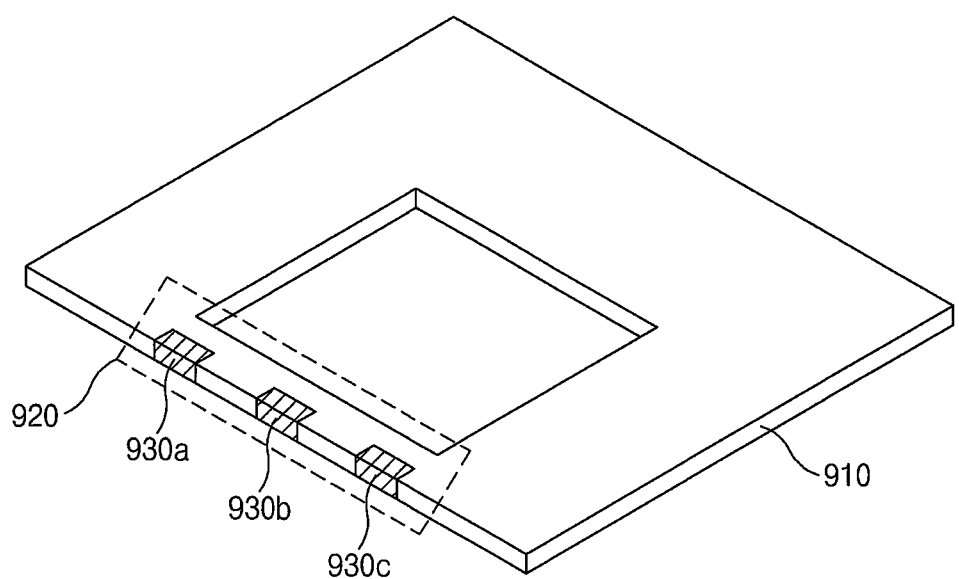
FIG. 9 illustrates a perspective view of a printed circuit board covered by a material layer for strength according to an embodiment of the present disclosure.

FIG. 9 illustrates a perspective view of a printed circuit board covered by a material layer for strength according to an embodiment of the present disclosure. Specifically, FIG. 9 illustrates a reference view of a side surface of a relatively narrow area 920 of the printed circuit board.

Although not illustrated in FIG. 9, a lead layer may be arranged throughout a relatively wide area 910 and a relatively narrow area 920, as illustrated in FIGS. 4 to 8. For example, FIG. 9 may be a view of the printed circuit board before the lead layer is arranged.

Referring to FIG. 9, plating layers 930a, 930b, and 930c are arranged at a side surface of the narrow area 920. The plating layers 930a, 930b, and 930c arranged on the side surface of the narrow area 920 may reinforce the narrow area 920 and prevent the layers of the multilayered printed circuit board from being separated from each other, at the same time.

An electronic device according to various embodiments of the present disclosure may include a printed circuit board that includes a first area, and a second area that extends from one end of the first area, and the second area has a small width as compared with the first area, and at least a portion of a surface of the second area is covered by at least one material layer for strength of the second area.

According to various embodiments of the present disclosure, the at least one material layer may include at least one of lead, copper, gold, silver, and tin.

According to various embodiments of the present disclosure, an uppermost layer of the at least one material layer that covers the surface of the second area may be a lead layer.

According to various embodiments of the present disclosure, the at least one material layer may not include a stainless steel layer.

According to various embodiments of the present disclosure, the surface of the second area may include at least one of a surface that is close to a front side of the electronic device, a surface that is close to a rear side of the electronic device, and a surface that is close to a lateral side of the electronic device.

According to various embodiments of the present disclosure, the surface of the second area, the uppermost layer of which is covered by the lead layer, may be close to a front side or a rear side of the electronic device.

According to various embodiments of the present disclosure, the surface of the second area that is close to the side surface of the electronic device may be plated by at least one of a copper layer, a gold layer, or a silver layer.

According to various embodiments of the present disclosure, a whole surface of the second area may be covered by at least one material layer for strength of the second area.

According to various embodiments of the present disclosure, the at least one material layer for strength of the second area may be continuously arranged on the surface of the second area.

According to various embodiments of the present disclosure, the at least one material layer for strength of the second area may be arranged in spaced areas of the surface of the second area.

According to various embodiments of the present disclosure, the at least one material layer for strength of the second area may have a width, at least a portion of which is different from the other portions thereof along a direction in which the second area extends.

According to various embodiments of the present disclosure, one end of the second area, which is close to the first area, may have a large width as compared with one end of the second area, which is far from the first area.

According to various embodiments of the present disclosure, the at least one material layer for strength of the second area may be arranged on a surface of the first area, which is close to the second area.

According to various embodiments of the present disclosure, a through-hole may be arranged at at least a portion of the printed circuit board, and the second area is adjacent to the through-hole.

According to various embodiments of the present disclosure, the electronic device may further include at least one of a speaker and a camera sensor, and the at least one of the speaker and the camera sensor may be arranged in the through-hole.

An electronic device according to various embodiments of the present disclosure may include a housing, a printed circuit board (PCB) that is arranged inside the housing and that includes a first surface that faces a first direction, a second surface that faces a second direction that is opposite to the first direction, and a side surface that faces a third direction that is different from the first direction and the second direction, an opening that is arranged adjacent to a portion of the side surface of the printed circuit board, an electronic component(or electronic part, or electronic element) at least a portion of which is arranged in the opening, and a conductive material that electrically connects the electronic component and the printed circuit board, and the opening may be defined by a portion of the printed circuit board and a structure that extends from the printed circuit board, and at least a portion of the structure may be formed of or covered by the conductive material.

According to various embodiments of the present disclosure, the conductive material may include at least one of lead, copper, gold, silver, and tin.

According to various embodiments of the present disclosure, an uppermost layer of the structure may be covered by lead.

According to various embodiments of the present disclosure, the uppermost layer of the structure, which is covered by lead, may have an uneven portion or an area having different heights.

According to various embodiments of the present disclosure, the electronic component may include at least one of a speaker and a camera sensor.

According to at least one of the above-described solutions of the present disclosure, the electronic device according to various embodiments of the present disclosure may include a printed circuit board that includes a relatively thin area as compared with the other areas. In this case, a surface of the relatively thin area may be covered by at least one material for strength of the thin area. Accordingly, the thin area may be prevented from being deflected or cracked by an impact to the electronic device.

Figure 10:
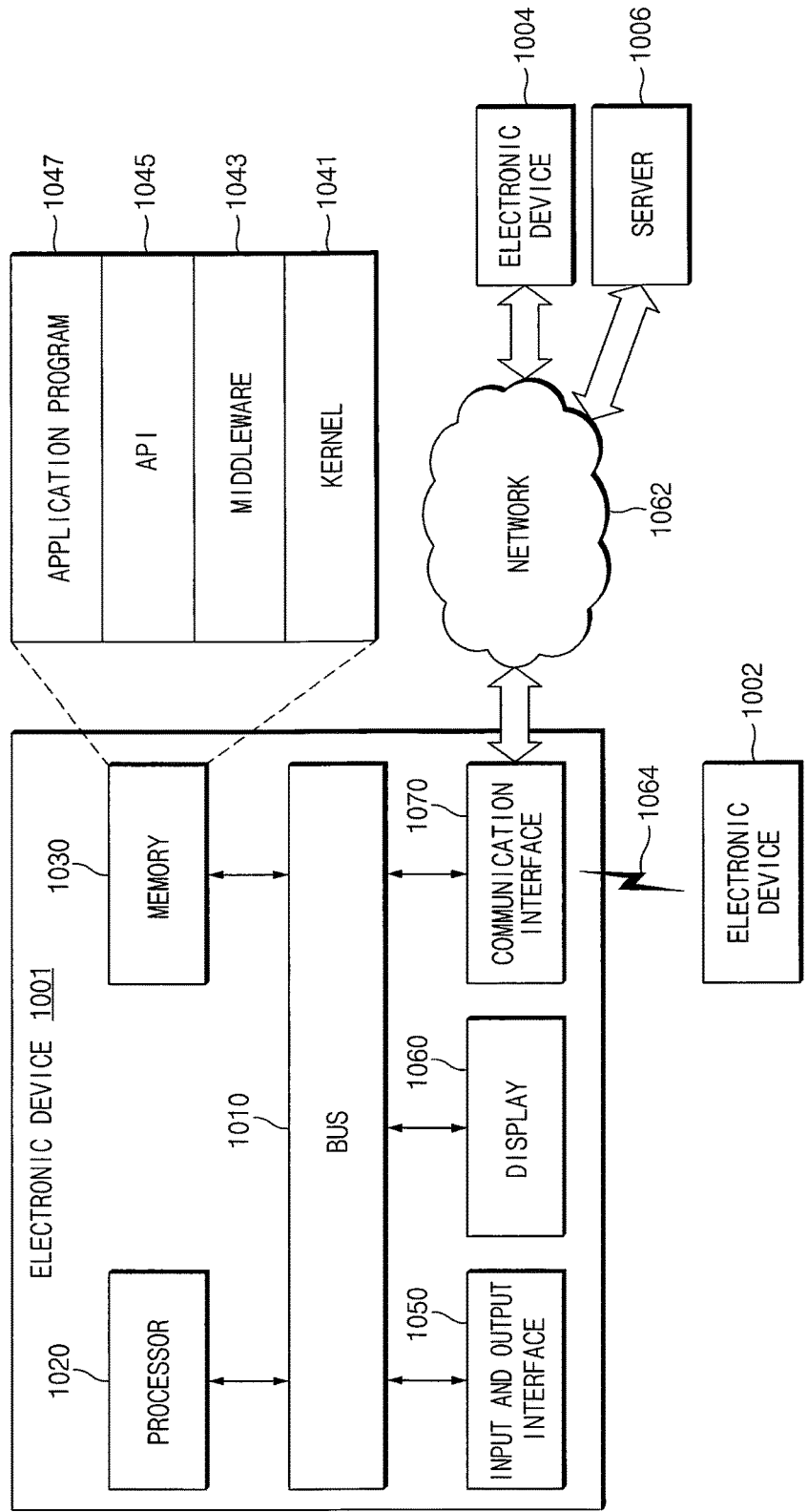
FIG. 10 illustrates an electronic device in a network environment according to an embodiment of the present disclosure.

FIG. 10 illustrates an electronic device in a network environment according to an embodiment of the present disclosure.

Referring to FIG. 10, an electronic device 1001 and a first external electronic device 1002, a second external electronic device 1004, and a server 1006 may connect with each other through a network 1062 or local-area communication 1064. The electronic device 1001 includes a bus 1010, a processor 1020, a memory 1030, an input and output interface 1050, a display 1060, and a communication interface 1070. At least one of the components may be omitted from the electronic device 1001, and/or other components may be additionally included in the electronic device 1001.

The bus 1010 may be a circuit which connects the components 1020 to 1070 with each other and transmits a communication signal (e.g., a control message and/or data) between the components.

The processor 1020 may include one or more of a CPU, an application processor (AP), or a communication processor (CP). For example, the processor 1020 may perform calculation or data processing about control and/or communication of at least another of the components of the electronic device 1001.

The memory 1030 may include a volatile and/or non-volatile memory. The memory 1030 may store a command or data associated with at least another of the components of the electronic device 1001. The memory 1030 stores software and/or a program 1040. The program 1040 includes a kernel 1041, a middleware 1043, an application programming interface (API) 1045, and an application program 1047. At least part of the kernel 1041, the middleware 1043, or the API 1045 may be referred to as an operating system (OS).

The kernel 1041 may control or manage, for example, system resources (e.g., the bus 1010, the processor 1020, the memory 1030, etc.) used to execute an operation or function implemented in the other programs (e.g., the middleware 1043, the API 1045, or the application program 1047). Also, as the middleware 1043, the API 1045, or the application program 1047 accesses a separate component of the electronic device 1001, the kernel 1041 may provide an interface which may control or manage system resources.

The middleware 1043 may play a role as a go-between such that the API 1045 or the application program 1047 communicates with the kernel 1041 to communicate data.

The middleware 1043 may process one or more work requests, received from the application program 1047, in order of priority. For example, the middleware 1043 may assign priority which may use system resources (the bus 1010, the processor 1020, the memory 1030, etc.) of the electronic device 1001 to at least one of the at least one application program 1047. For example, the middleware 1043 may perform scheduling or load balancing for the one or more work requests by processing the one or more work requests in order of the priority assigned to the at least one of the at least one application program 1047.

The API 1045 may be an interface in which the application program 1047 controls a function provided from the kernel 1041 or the middleware 1043. For example, the API 1045 may include at least one interface or function (e.g., a command) for file control, window control, image processing, or text control, etc.

The input and output interface 1050 may transmit a command or data input from a user or another external device to another component (or other components) of the electronic device 1001. The input and output interface 1050 may output an instruction or data received from another component (or other components) of the electronic device 1001 to the user or the other external device.

The display 1060 may include a liquid crystal display (LCD), a light emitting diode (LED) display, an organic LED (OLED) display, a microelectromechanical systems (MEMS) display, or an electronic paper display. The display 1060 may display a variety of content (e.g., text, images, videos, icons, symbols, etc.) to the user. The display 1060 may include a touch screen, and may receive a touch input, a gesture input, a proximity input, and/or a hovering input using an electronic pen or part of a body of the user.

The communication interface 1070 may establish communication between the electronic device 1001 and the first external electronic device 1002, the second external electronic device 1004, and/or the server 1006. For example, the communication interface 1070 may connect to a network 1062 through wireless communication or wired communication and may communicate with the second external electronic device 1004 or the server 1006.

The wireless communication may use at least one of long term evolution (LTE), LTE-advanced (LTE-A), code division multiple access (CDMA), wideband CDMA (WCDMA), universal mobile telecommunications system (UMTS), wireless broadband (WiBro), global system for mobile communications (GSM), etc., as a cellular communication protocol. The wireless communication may include local-area communication 1064, e.g., wireless-fidelity (Wi-Fi) communication, Bluetooth (BT) communication, near field communication (NFC), global navigation satellite system (GNSS) communication, etc.

An MST module may generate a pulse based on transmission data using an electromagnetic signal and may generate a magnetic field signal based on the pulse. The electronic device 1001 may output the magnetic field signal to a POS system, which may restore the data by detecting the magnetic field signal using an MST reader and converting the detected magnetic field signal into an electric signal.

The GNSS may include at least one of a global positioning system (GPS), a Glonass, a Beidou navigation satellite system (hereinafter referred to as "Beidou"), a Galileo (i.e., the European global satellite-based navigation system) according to an available area or a bandwidth, etc.

The wired communication may include at least one of universal serial bus (USB) communication, high definition multimedia interface (HDMI) communication, recommended standard 232 (RS-232) communication, plain old telephone service (POTS) communication, etc. The network 1062 may include a telecommunications network, such as a computer network (e.g., a local area network (LAN) or a wide area network (WAN)), the Internet, or a telephone network.

Each of the first and second external electronic devices 1002 and 1004 may be the same as or different device from the electronic device 1001.

The server 1006 may include a group of one or more servers.

All or some of operations executed in the electronic device 1001 may be executed in the first external electronic device 1002, the second external electronic device 1004, and/or the server 1006. For example, if the electronic device 1001 should perform any function or service, it may request the first external electronic device 1002, the second external electronic device 1004, and/or the server 106 to perform at least part of the function or service, rather than executing the function or service for itself or in addition to the function or service. The first external electronic device 1002, the second external electronic device 1004, and/or the server 1006 may execute the requested function or the added function and may transmit the executed result to the electronic device 1001. The electronic device 1001 may process the received result without change or additionally and may provide the requested function or service. For example, cloud computing technologies, distributed computing technologies, or client-server computing technologies may be used.

Figure 11:
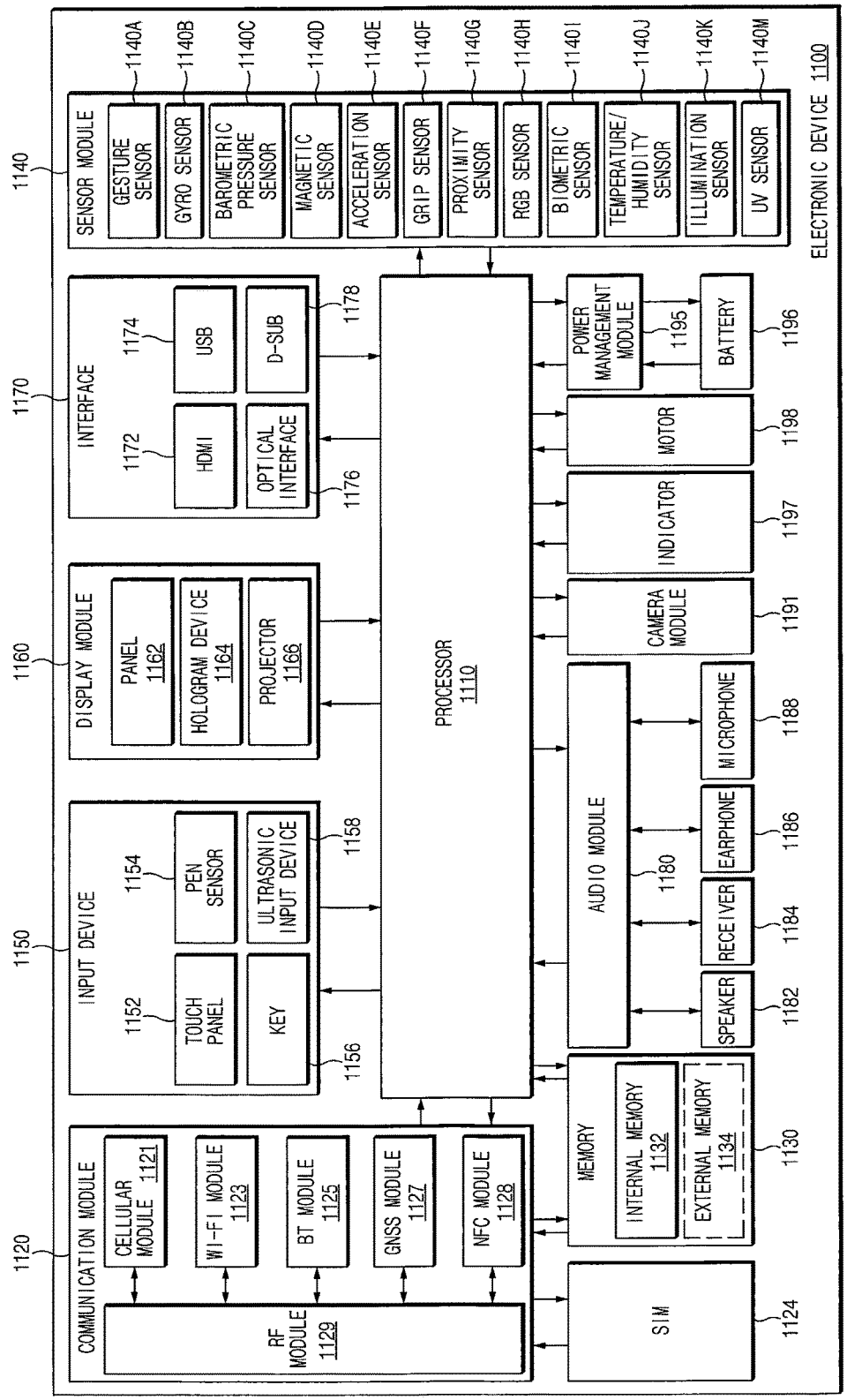
FIG. 11 illustrates an electronic device according to an embodiment of the present disclosure.

FIG. 11 illustrates an electronic device according to an embodiment of the present disclosure.

Referring to FIG. 11, the electronic device 1101 includes a processor 1110 (e.g., an AP), a communication module 1120, a subscriber identification module (SIM) 1124, a memory 1130, a sensor module 1140, an input device 1150, a display 1160, an interface 1170, an audio module 1180, a camera module 1191, a power management module 1195, a battery 1196, an indicator 1197, and a motor 1198.

The processor 1110 may drive an OS or an application program to control a plurality of hardware or software components connected thereto and may process and compute a variety of data. The processor 1110 may be implemented with a system on chip (SoC). The processor 1110 may include a graphic processing unit (GPU) and/or an image signal processor. The processor 1110 may include at least some (e.g., a cellular module 1121) of the components shown in FIG. 11. The processor 1110 may load a command or data received from at least one of other components (e.g., a non-volatile memory) into a volatile memory to process the data and may store various data in a non-volatile memory.

The communication module 1120 includes the cellular module 1121, a wireless-fidelity (Wi-Fi) module 1123, a Bluetooth (BT) module 1125, a GNSS module 1127 (e.g., a GPS module, a Glonass module, a Beidou module, or a Galileo module), an NFC module 1128, and a radio frequency (RF) module 1129.

The cellular module 1121 may provide a voice call service, a video call service, a text message service, an Internet service, etc., through a communication network. The cellular module 1121 may identify and authenticate the electronic device 1101 in a communication network using the SIM 1124 (e.g., a SIM card). The cellular module 1121 may perform at least part of functions which may be provided by the processor 1110. The cellular module 1121 may include a communication processor (CP).

The Wi-Fi module 1123, the BT module 1125, the GNSS module 1127, or the NFC module 1128 may include a processor for processing data transmitted and received through the corresponding module. At least some of the cellular module 1121, the Wi-Fi module 1123, the BT module 1125, the GNSS module 1127, or the NFC module 1128 may be included in one integrated chip (IC) or one IC package.

The RF module 1129 may transmit and receive a communication signal (e.g., an RF signal). Though not shown, the RF module 1129 may include a transceiver, a power amplifier module (PAM), a frequency filter, or a low noise amplifier (LNA), an antenna, etc. At least one of the cellular module 1121, the Wi-Fi module 1123, the BT module 1125, the GNSS module 1127, or the NFC module 1128 may transmit and receive an RF signal through a separate RF module.

The SIM 1124 may include, for example, a card which includes a SIM and/or an embedded SIM. The SIM 1124 may include unique identification information (e.g., an integrated circuit card identifier (ICCID)) or subscriber information (e.g., an international mobile subscriber identity (IMSI)).

The memory 1130 includes an embedded memory 1132 and an external memory 1134. The embedded memory 1132 may include at least one of a volatile memory (e.g., a dynamic random access memory (DRAM), a static RAM (SRAM), a synchronous dynamic RAM (SDRAM), etc.), or a non-volatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory (e.g., a NAND flash memory or a NOR flash memory, etc.), a hard drive, or a solid state drive (SSD)).

The external memory 1134 may include a flash drive, a compact flash (CF), a secure digital (SD), a micro-SD, a mini-SD, an extreme digital (xD), a multimedia car (MMC), or a memory stick, etc. The external memory 1134 may operatively and/or physically connect with the electronic device 1101 through various interfaces.

The sensor module 1140 may measure a physical quantity or may detect an operation state of the electronic device 1101, and may convert the measured or detected information to an electric signal. The sensor module 1140 includes a gesture sensor 1140A, a gyro sensor 1140B, a barometer sensor 1140C, a magnetic sensor 1140D, an acceleration sensor 1140E, a grip sensor 1140F, a proximity sensor 1140G, a color sensor 1140H (e.g., red, green, blue (RGB) sensor), a biometric sensor 11401, a temperature/humidity sensor 1140J, an illumination sensor 1140K, and an ultraviolet (UV) sensor 1140M. Additionally or alternatively, the sensor module 1140 may further include an e-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 1140 may further include a control circuit for controlling at least one or more sensors included therein. The electronic device 1101 may further include a processor configured to control the sensor module 1140, as part of the processor 1110 or to be independent of the processor 1110. While the processor 1110 is in a sleep state, the electronic device 1101 may control the sensor module 1140.

The input device 1150 includes a touch panel 1152, a (digital) pen sensor 1154, a key 1156, and an ultrasonic input device 1158. The touch panel 1152 may use at least one of a capacitive type, a resistive type, an infrared type, and an ultrasonic type. The touch panel 1152 may further include a control circuit. The touch panel 1152 may further include a tactile layer and may provide a tactile reaction to a user.

The (digital) pen sensor 1154 may be part of the touch panel 1152 or may include a separate sheet for recognition.

The key 1156 may include a physical button, an optical key, or a keypad.

The ultrasonic input device 1158 may allow the electronic device 1101 to detect a sound wave using a microphone 1188 and to verify data through an input tool generating an ultrasonic signal.

The display 1160 includes a panel 1162, a hologram device 1164, and a projector 1166. The panel 1162 may be implemented to be flexible, transparent, and/or wearable. The panel 1162 and the touch panel 1152 may be integrated into one module.

The hologram device 1164 may show a stereoscopic image in a space using interference of light.

The projector 1166 may project light onto a screen to display an image. The screen may be positioned, for example, inside or outside the electronic device 1101.

The display 1160 may further include a control circuit for controlling the panel 1162, the hologram device 1164, and/or the projector 1166.

The interface 1170 includes a high-definition multimedia interface (HDMI) 1172, a universal serial bus (USB) 1174, an optical interface 1176, and a D-subminiature 1178. Additionally or alternatively, the interface 1170 may include a mobile high definition link (MHL) interface, an SD card/multimedia card (MMC) interface, or an infrared data association (IrDA) standard interface.

The audio module 1180 may convert a sound and an electric signal in dual directions. The audio module 1180 may process sound information input or output through a speaker 1182, a receiver 1184, an earphone 1186, the microphone 1188, etc.

The camera module 1191 captures still images and moving images. The camera module 1191 may include one or more image sensors (e.g., a front sensor or a rear sensor), a lens, an image signal processor (ISP), or a flash (e.g., an LED or a xenon lamp).

The power management module 1195 may manage power of the electronic device 1101. The power management module 1195 may include a power management integrated circuit (PMIC), a charger IC or a battery gauge. The PMIC may have a wired charging method and/or a wireless charging method. The wireless charging method may include, for example, a magnetic resonance method, a magnetic induction method, an electromagnetic method, etc. An additional circuit for wireless charging, such as a coil loop, a resonance circuit, a rectifier, etc., may be further provided.

The battery gauge may measure the remaining capacity of the battery 1196 and voltage, current, or temperature thereof, while the battery 1196 is charged.

The battery 1196 may include a rechargeable battery or a solar battery.

The indicator 1197 may display a specific state of the electronic device 1101 or part (e.g., the processor 1110) thereof, for example, a booting state, a message state, a charging state, etc.

The motor 1198 may convert an electric signal into mechanical vibration and may generate vibration, a haptic effect, etc.

The electronic device 1101 may also include a processing unit (e.g., a GPU) for supporting a mobile TV. The processing unit for supporting the mobile TV may process media data according to standards, for example, a digital multimedia broadcasting (DMB) standard, a digital video broadcasting (DVB) standard, a mediaFlo standard, etc.

Each of the above-mentioned elements of the electronic device according to various embodiments of the present disclosure may be configured with one or more components, and names of the corresponding elements may be changed according to the type of the electronic device. The electronic device according to various embodiments of the present disclosure may include at least one of the above-mentioned elements, some elements may be omitted from the electronic device, or other additional elements may be further included in the electronic device. Some of the elements of the electronic device according to various embodiments of the present disclosure may be combined with each other to form one entity, thereby making it possible to perform the functions of the corresponding elements in the same manner as before the combination.

Figure 12:
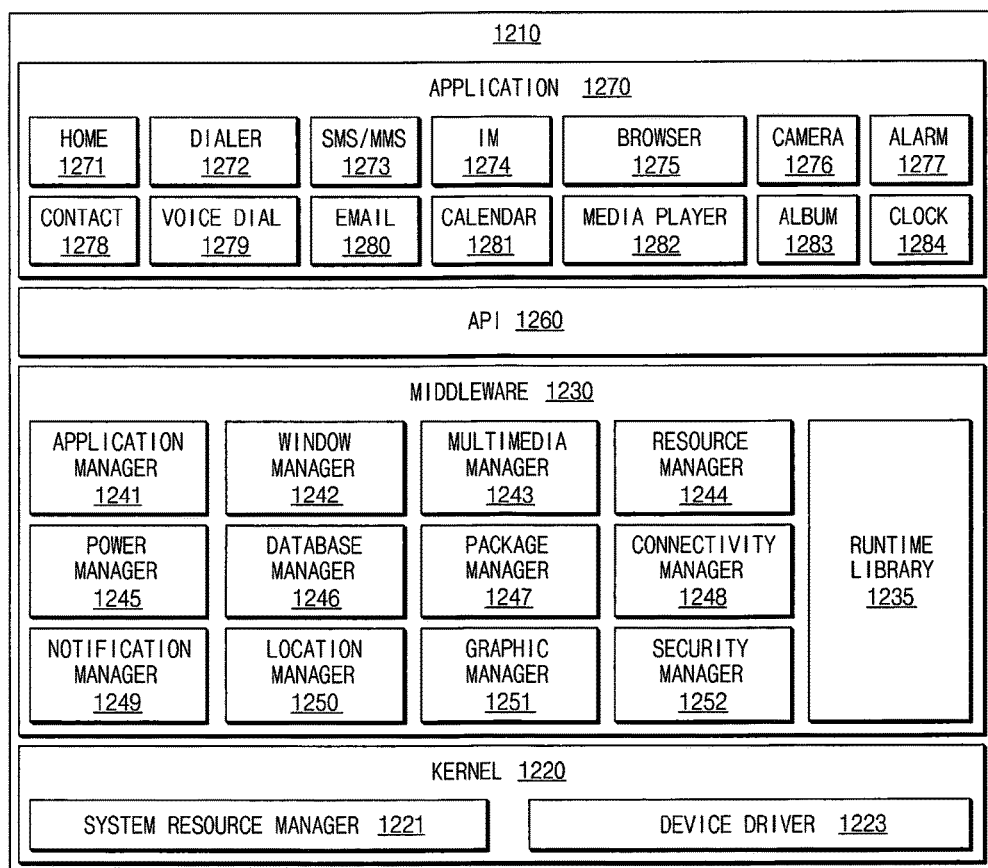
FIG. 12 illustrates a program module according to an embodiment of the present disclosure.

FIG. 12 illustrates a program module according to an embodiment of the present disclosure.

Referring to FIG. 12, the program module 1210 includes an operating system (OS) for controlling resources associated with an electronic device and/or various applications, which are executed on the OS. The OS may be, for example, Android®, iOS®, Windows®, Symbian®, Tizen®, or Bada®, etc.

The program module 1210 includes a kernel 1220, a middleware 1230, an application programming interface (API) 1260, and an application 1270. At least part of the program module 1210 may be preloaded on the electronic device, or may be downloaded from an external electronic device.

The kernel 1220 includes a system resource manager 1221 and a device driver 1223. The system resource manager 1221 may control, assign, or collect system resources. The system resource manager 1221 may include a process management unit, a memory management unit, a file system management unit, etc.

The device driver 1223 may include a display driver, a camera driver, a Bluetooth (BT) driver, a shared memory driver, a universal serial bus (USB) driver, a keypad driver, a wireless-fidelity (Wi-Fi) driver, an audio driver, and/or an inter-process communication (IPC) driver.

The middleware 1230 may provide functions the application 1270 needs in common, and may provide various functions to the application 1270 through the API 1260 such that the application 1270 efficiently uses limited system resources in the electronic device. The middleware 1230 includes a runtime library 1235, an application manager 1241, a window manager 1242, a multimedia manager 1243, a resource manager 1244, a power manager 1245, a database manager 1246, a package manager 1247, a connectivity manager 1248, a notification manager 1249, a location manager 1250, a graphic manager 1251, and a security manager 1252.

The runtime library 1235 may include a library module used by a compiler to add a new function through a programming language while the application 1270 is executed. The runtime library 1235 may perform a function about input and output management, memory management, or an arithmetic function.

The application manager 1241 may manage a life cycle of at least one of the application 1270.

The window manager 1242 may manage graphic user interface (GUI) resources used on a screen of the electronic device.

The multimedia manager 1243 may determine a format utilized for reproducing various media files and may encode or decode a media file using a codec corresponding to the corresponding format.

The resource manager 1244 may manage source codes of at least one of the application 1270, and may manage resources of a memory or a storage space.

The power manager 1245 may act together with a basic input/output system (BIOS), manage a battery or a power source, and provide power information utilized for an operation of the electronic device.

The database manager 1246 may generate, search, or change a database to be used in at least one of the application 1270.

The package manager 1247 may manage installation or update of an application distributed by a type of a package file.

The connectivity manager 1248 may manage wireless connection such as Wi-Fi connection or BT connection.

The notification manager 1249 may display or notify events, such as an arrival message, an appointment, and proximity notification.

The location manager 1250 may manage location information of the electronic device.

The graphic manager 1251 may manage a graphic effect to be provided to the user or a user interface (UI) related to the graphic effect.

The security manager 1252 may provide all security functions utilized for system security or user authentication, and the like.

When the electronic device has a phone function, the middleware 1230 may further include a telephony manager for managing a voice or video communication function of the electronic device.

The middleware 1230 may include a middleware module which configures combinations of various functions of the above-described components. The middleware 1230 may provide a module which specializes according to kinds of OSs to provide a differentiated function. The middleware 1230 may dynamically delete some of old components or may add new components.

The API 1260 may include a set of API programming functions, and may be provided with different components according to OSs. For example, for Android® or iOS®, one API set may be provided according to platforms. In Tizen®, two or more API sets may be provided according to platforms.

The application 1270 includes a home application 1271, a dialer application 1272, a short message service/multimedia message service (SMS/MMS) application 1273, an instant message (IM) application 1274, a browser application 1275, a camera application 1276, an alarm application 1277, a contact application 1278, a voice dial application 1279, an e-mail application 1280, a calendar application 1281, a media player application 1282, an album application 1283, and a clock application 1284. Additionally or alternatively, the application 1270 may include a health care application (e.g., an application for measuring quantity of exercise or blood sugar), an environment information application (e.g., an application for providing atmospheric pressure information, humidity information, temperature information, etc.), etc.

The application 1270 may include an information exchange application for exchanging information between the electronic device and an external electronic device. The information exchange application may include a notification relay application for transmitting specific information to the external electronic device or a device management application for managing the external electronic device.

For example, the notification relay application may include a function of transmitting notification information, which is generated by other applications (e.g., the SMS/MMS application 1273, the e-mail application 1280, the health care application, the environment information application, etc.) of the electronic device, to the external electronic device. Also, the notification relay application may receive notification information from the external electronic device, and may provide the received notification information to the user of the electronic device.

The device management application may manage (e.g., install, delete, or update), for example, at least one (e.g., a function of turning on/off the external electronic device itself (or partial components) or a function of adjusting brightness (or resolution) of a display) of functions of the external electronic device which communicates with the electronic device, an application which operates in the external electronic device, or a service (e.g., a call service or a message service) provided from the external electronic device.

The application 1270 may include an application, which is preset according to attributes of the external electronic device (e.g., the health card application of a mobile medical device).

The application 1270 may include an application received from the external electronic device. The application 1270 may include a preloaded application or a third party application which may be downloaded from a server.

Names of the components of the program module 1210 according to various embodiments of the present disclosure may differ according to kinds of OSs.

At least part of the program module 1210 may be implemented with software, firmware, hardware, or at least two or more combinations thereof. At least part of the program module 1210 may be implemented (e.g., executed) by, for example, a processor. At least part of the program module 1210 may include a module, a program, a routine, sets of instructions, a process, etc., for performing one or more functions.

The term "module" used herein may mean a unit including one of hardware, software, and firmware or two or more combinations thereof. The term "module" may be interchangeably used with "unit", "logic", "logical block", "component", "circuit", etc. A "module" may be a minimum unit of an integrated component or a part thereof. A "module" may be a minimum unit performing one or more functions or a part thereof. A "module" may be mechanically or electronically implemented. For example, a "module" may include at least one of an application-specific integrated circuit (ASIC) chip, field-programmable gate arrays (FPGAs), or a programmable-logic device, which is well known or will be developed in the future, for performing certain operations.

At least part of a device (e.g., modules or the functions) or a method (e.g., operations) may be implemented with instructions stored in computer-readable storage media which have a program module. When the instructions are executed by a processor, one or more processors may perform functions corresponding to the instructions. The computer-readable storage media may be, for example, a memory.

The computer-readable storage media may include a hard disc, a floppy disk, magnetic media (e.g., a magnetic tape), optical media (e.g., a compact disc read only memory (CD-ROM) and a digital versatile disc (DVD)), magneto-optical media (e.g., a floptical disk), a hardware device (e.g., a ROM, a random access memory (RAM), a flash memory, etc.), etc. The program instructions may include mechanical codes compiled by a compiler and high-level language codes that may be executed by a computer using an interpreter.

The above-mentioned hardware device may be configured to operate as one or more software modules to perform operations according to various embodiments of the present disclosure, and vice versa.

Modules or program modules according to various embodiments of the present disclosure may include at least one or more of the above-mentioned components, some of the above-mentioned components may be omitted, or other additional components may be further included. Operations executed by modules, program modules, or other components may be executed by a successive method, a parallel method, a repeated method, or a heuristic method. Some operations may be executed in a different order or may be omitted, and other operations may be added.

Embodiments of the present disclosure described and shown in the drawings are provided as examples to describe technical content and help understanding but do not limit the present disclosure. Accordingly, it should be interpreted that besides the embodiments listed herein, all modifications or modified forms derived based on the technical ideas of the present disclosure are included in the present disclosure as defined in the claims, and their equivalents.

The above-described embodiments of the present disclosure can be implemented in hardware, firmware or via the execution of software or computer code that can be stored in a recording medium such as a CD ROM, a DVD, a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc., that may store or receive software or computer code that when accessed and executed by the computer, processor or hardware implement the processing methods described herein.

A control unit may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc. In addition, when a general purpose computer accesses code for implementing the processing shown herein, the execution of the code transforms the general purpose computer into a special purpose computer for executing the processing shown herein. Any of the functions and steps provided in the Figures may be implemented in hardware, software or a combination of both and may be performed in whole or in part within the programmed instructions of a computer. No claim element herein is to be construed under the provisions of 35 U.S.C. 112, sixth paragraph, unless the element is expressly recited using the phrase "means for". In addition, an artisan understands and appreciates that a "processor" or "microprocessor" may be hardware in the claimed disclosure.

While the present disclosure has been shown and described with reference to certain embodiments thereof, it will be understood by those skilled in the art that various changes in form and details may be made therein without departing from the spirit and scope of the present disclosure as defined by the appended claims and their equivalents.

What is claimed is:

1. An electronic device comprising:
   a printed circuit board including a first area, and a second area that extends from a first end of the first area,
   wherein a width of the second area is smaller than a width of the first area, and at least a portion of a surface of the second area is covered by a material layer such that a strength of the second area is greater than a strength of the first area, and
   wherein the material layer is arranged on a surface of the first area.

2. The electronic device of claim 1, wherein the material layer comprises at least one of lead, copper, gold, silver, and tin, and
   wherein an uppermost layer of the material layer that covers the surface of the second area comprises a lead layer.

3. The electronic device of claim 2, wherein the surface of the second area, the uppermost layer of which is covered by the lead layer, faces a front side or a rear side of the electronic device.

4. The electronic device of claim 3, wherein the surface of the second area that faces a side surface of the electronic device is plated by at least one of a copper layer, a gold layer, or a silver layer.

5. The electronic device of claim 1, wherein the printed circuit board further includes a through-hole that vertically passes arranged between the first area and the second area.

6. The electronic device of claim 1, wherein the material layer comprises a part formed by a lead and the material layer comprises the rest part formed by a stainless steel layer.

7. The electronic device of claim 1, wherein the surface of the second area faces one of a front side of the electronic device, a rear side of the electronic device, and a lateral side of the electronic device.

8. The electronic device of claim 1, wherein the entire surface of the second area is covered by the material layer.

9. The electronic device of claim 1, wherein the material layer is continuously arranged on the surface of the second area.

10. The electronic device of claim 1, wherein the material layer is arranged in spaced intervals on the surface of the second area.

11. The electronic device of claim 1, wherein a width of a portion of the material layer is different from a width of other portions of the material layer.

12. The electronic device of claim 11, wherein a first end of the second area, which faces the first area, has a larger width than a second end of the second area, which faces away from the first area.

13. The electronic device of claim 1, wherein the printed circuit board further includes a through-hole, and the second area is adjacent to the through-hole.

14. The electronic device of claim 13, further comprising at least one of:
   a speaker; and
   a camera sensor,
   wherein the at least one of the speaker and the camera sensor is arranged in the through-hole.

* * * * *

UNITED STATES PATENT AND TRADEMARK OFFICE
CERTIFICATE OF CORRECTION

PATENT NO. : 10,342,127 B2  
APPLICATION NO. : 15/351087  
DATED : July 2, 2019  
INVENTOR(S) : Jung Hoon Park et al.

Page 1 of 1

It is certified that error appears in the above-identified patent and that said Letters Patent is hereby corrected as shown below:

On the Title Page

Add Item (30) Foreign Application Priority Data:  
Nov. 13, 2015 (KR) .......................... 10-2015-0160004

Signed and Sealed this  
Third Day of September, 2019

Andrei Iancu  
*Director of the United States Patent and Trademark Office*